(12) United States Patent
Bojkov et al.

(10) Patent No.: US 7,271,030 B2
(45) Date of Patent: Sep. 18, 2007

(54) DIRECT BUMPING ON INTEGRATED CIRCUIT CONTACTS ENABLED BY METAL-TO-INSULATOR ADHESION

(75) Inventors: Christo P. Bojkov, Plano, TX (US); Orlando F. Torres, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/302,863

(22) Filed: Dec. 13, 2005

(65) Prior Publication Data

US 2006/0091541 A1  May 4, 2006

Related U.S. Application Data

(62) Division of application No. 10/689,386, filed on Oct. 20, 2003, now Pat. No. 7,005,752.

(51) Int. Cl.
*H01L 21/00* (2006.01)
(52) U.S. Cl. ............... 438/107; 257/E21.511
(58) Field of Classification Search ............. 438/106, 438/107
See application file for complete search history.

(56) References Cited

U.S. PATENT DOCUMENTS

| | | | |
|---|---|---|---|
| 5,736,456 A | 4/1998 | Akram | 438/614 |
| 6,166,444 A | 12/2000 | Hsuan et al. | 257/777 |
| 6,417,089 B1 | 7/2002 | Kim et al. | 438/612 |
| 6,620,720 B1 | 9/2003 | Moyer et al. | 438/612 |
| 6,782,897 B2 | 8/2004 | Wang et al. | 134/1.2 |
| 6,995,475 B2 * | 2/2006 | Biggs et al. | 257/784 |
| 2002/0043723 A1 | 4/2002 | Shimizu et al. | 257/758 |
| 2004/0151844 A1 * | 8/2004 | Zhang et al. | 427/569 |
| 2006/0033198 A1 * | 2/2006 | Noma et al. | 257/698 |

* cited by examiner

*Primary Examiner*—W. David Coleman
(74) *Attorney, Agent, or Firm*—Yingsheng Tung; Wade James Brady, III; Frederick J. Telecky, Jr.

(57) ABSTRACT

A semiconductor device including a contact pad and circuit metallization on the surface of an integrated circuit (IC) chip comprises a stack of protection layers over the surface of the chip. The stack consists of a first inorganic layer (303, preferably silicon nitride) on the chip surface, followed by a polymer layer (306, preferably benzocyclobutene) on the first inorganic layer (303), and finally an outermost second inorganic layer (310, preferably silicon dioxide) on the polymer layer (303). A window (301*a*) in the stack of layers exposes the metallization (301) of the IC. A patterned seed metal layer (307, preferably copper) is on the metallization (301) in the window and on the second inorganic layer (310) around the window. A buffer metal layer (308, preferably copper) is positioned on the seed metal layer (307). A metal reflow element (309) is attached to the buffer metal (308).

6 Claims, 2 Drawing Sheets

DIRECT BUMPING ON INTEGRATED CIRCUIT CONTACTS ENABLED BY METAL-TO-INSULATOR ADHESION

This is a divisional application of application Ser. No. 10/689,386 filed Oct. 20, 2003, the contents of which are herein incorporated by reference in its entirety. Now U.S. Pat. No. 7,005,752.

FIELD OF THE INVENTION

The present invention is related in general to the field of semiconductor devices and processes and more specifically to methods for sealing and protecting integrated circuit bonding pads to reduce the risk of delamination.

DESCRIPTION OF THE RELATED ART

When an integrated circuit (IC) chip is to be assembled on a substrate by the flip-chip technology, the connecting members between chip and substrate are typically shaped as balls or bumps, and are commonly made of reflowable metals such as solder. The chip metallization has most commonly been aluminum. For aluminum, it has been studied extensively in the semiconductor technology, how the chip contact pads have to be prepared to employ solder connections successfully. Because solder and the easily-oxidized aluminum cannot be contacted reliably, a major part of the pad preparation includes the deposition of so-called "under bump metals". These metals form typically one or more layers over the contact pad proper; they provide ohmic contact to the chip metallization, tight seals with the protective chip overcoat in order to prevent moisture ingress or corrosive attack of the pad, and permit attachment of solder bumps. For aluminum chip metallization, these technical challenges have been successfully mastered.

However, changes implemented in the chip structure to satisfy the ongoing trends of device miniaturization and higher circuit speeds have recently confronted the flip-chip assembly technology with several new challenges. As a consequence of device miniaturization, the RC time constant of the interconnection between active circuit elements increasingly dominates the achievable IC speed-power product. Consequently, there is a strong need to replace the relatively high impedance of the traditional aluminum metallization by the lower impedance of metals such as copper.

For copper, the selection and fabrication of under bump metals has to be changed. A process practiced by the industry is based on forming a layer of aluminum over the copper bond pad and thus re-constructing the traditional situation of an aluminum pad. This process, though, has a number of drawbacks due to technical and cost issues. An alternative solution has yet not been developed.

Another change to advance the electrical characteristics involves the adoption of low-k dielectric materials in the chip circuitry. These materials are mechanically much weaker than the conventional silicon dioxide layers, and therefore much more sensitive to thermo-mechanical stress. These stresses, on the other hand, originate in assembled chips from the difference in the coefficients of thermal expansion (CTE) between the semiconductor chip material and the plastic substrate material. Examples of semiconductor materials are silicon, silicon germanium, or gallium arsenide; the CTE for silicon, for instance, is approximately 2 to 3 ppm/° C. An example of a plastic substrate material is FR-4 with a CTE of approximately 25 ppm/° C., resulting in a CTE difference between silicon and FR-4 of about an order of magnitude. As a consequence of this CTE difference, thermo-mechanical stresses are created at the solder interconnections between chip and substrate, especially in the regions of the joints, when the assembly is subjected to temperature cycling during device usage or reliability testing. These stresses tend to fatigue the joints and the bumps, and result in cracks in solder joints and underlying insulating chip materials, resulting in eventual failure of the assembly.

A commonly practiced method to absorb part of the thermo-mechanical stress on the solder joints utilizes a polymer layer on top of the chip protective overcoat to surround the joints and locally fill the gap between chip and substrate. This technique is also helpful in mitigating the stress on the chip dielectric material underlying the contact pads. The polymer has to be heat tolerant enough to withstand the solder reflow temperature, but it is poorly suited for adhesion to the under bump metals.

Consequently, a need has arisen for a chip pad structure and fabrication method, which offers solder bump reliability under the thermo-mechanical stresses of flip-chip assemblies, when copper is used as chip metallization and low-k dielectric materials are present under the chip contact pads. The methodology should be coherent, low-cost, and flexible enough to be applied to different semiconductor product families and a wide spectrum of design and process variations. Preferably, these innovations should be accomplished using the installed equipment base so that no investment in new manufacturing machines is needed.

SUMMARY OF THE INVENTION

One embodiment of the invention is a semiconductor device including a contact pad and circuit metallization on the surface of an integrated circuit (IC) chip. The device comprises a stack of protection layers over the surface of the chip; the stack consists of a first inorganic layer on the chip surface, followed by a polymer layer on the first inorganic layer, and finally a second inorganic layer on the polymer layer. A window in the stack of layers exposes the metallization on the IC chip. A patterned seed metal layer such as copper is on the metallization in the window and on the second inorganic layer around the window. A buffer metal layer, preferably copper, is positioned on the seed metal layer. A metal reflow element, such as a bump, is attached to the buffer metal. In another embodiment, the buffer metal is a stack of layers and a wire bond is attached to the top metal layer.

In another embodiment, the buffer metal layer is remote from the window to the IC metallization, but connected to the window by a rerouting trace of the seed metal. By rerouting, the reflow bumps may be positioned in a more uniform, less crowded pattern, and may also permit larger reflow bump sizes. Further, at the remote bump positions, thicker buffer layers are available to mitigate thermo-mechanical stresses and thus protect neighboring brittle low-k dielectrics materials.

The first inorganic layer is selected so that it is essentially impenetrable to moisture; preferred materials include silicon nitride, silicon oxynitride, and silicon carbide. The polymer layer is selected so that it provides a buffer mitigating and absorbing thermo-mechanical stress; preferred materials include polyimides, polyamic acids, polybenzoxazoles, benzocyclobutenes, and polysiloxanes. The second inorganic layer is selected so that it can form mechanically strong seals with metal layers such as copper; preferred materials include silicon dioxide, silicon nitride, and silicon oxynitride.

Another embodiment of the invention is a wafer-level method for completing the fabrication of bonding pads on IC wafers with interconnection metallization. According to the method, a stack of protection layers is deposited over the wafer surface; the stack includes a first layer of inorganic material, followed by a layer of polymer material, and topped by a second layer of inorganic material. The stack of protection layers is patterned by opening a plurality of windows in the stack to expose portions of the chip interconnection metallization. A conductive seed layer is then deposited, covering the patterned stack in order to establish ohmic contact to the metallization exposed in the windows and to create a mechanically strong seal between the seed metal and the topmost layer of inorganic material. Next, a patterned buffer metal layer is deposited onto the exposed seed layer. Finally, the seed layer portions outside the buffer metal layer are removed.

In another embodiment, patterned metal traces are defined, which redistribute the connections between the buffer metal layers and the windows to the chip metallization.

Embodiments of the present invention are related to solder-ball and wire-bonded IC assemblies, semiconductor device packages, surface mount and chip-scale packages. It is a technical advantage that the invention offers a low-cost method of improving the adhesion of under bump metal layers to insulating layers, especially polymer insulators. It is an additional technical advantage that the invention facilitates the rerouting of solder bump and wire bond locations to contact pads, thus offering a method to distribute the interconnecting reflow bumps more uniformly over the whole device area and to prevent stress-related damage to brittle low-k dielectric layers under the contact pads. Further technical advantages include the opportunity to scale the assembly to smaller dimensions, supporting the ongoing trend of IC miniaturization, and to distribute the chip contacts more evenly over the chip area rather than restricting the contacts to a linear arrangement along the chip perimeters.

The technical advantages represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to U.S. patent application Ser. No. 10/086,117, filed on Feb. 26, 2002 (Bojkov et al., "Waferlevel Method for Direct Bumping on Copper Pads in Integrated Circuits").

Figure 1:
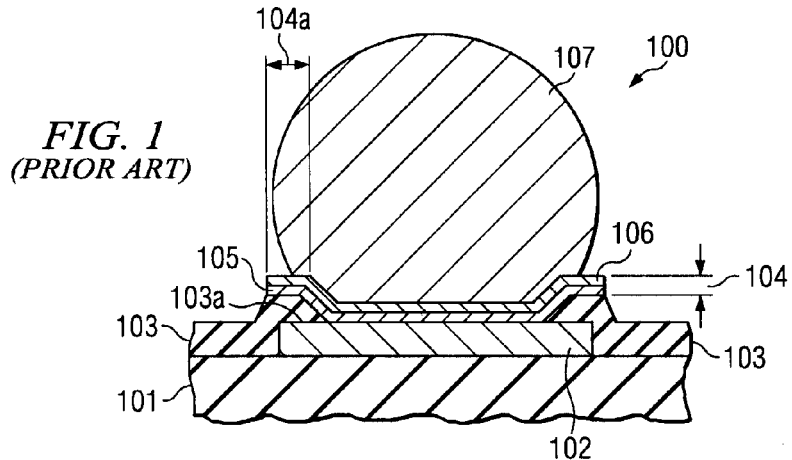
FIG. 1 is a schematic cross section of a portion of a flip-chip assembly with solder bumps, as fabricated by known technology.

The impact of the present invention can be most easily appreciated by highlighting the shortcomings of the known approaches to form contacts to integrated circuits (ICs). FIG. 1 illustrates schematically an example of the metallurgical requirements in known technology for a contact pad of a small portion of an IC chip generally designated 100. A semiconductor material 101, typically silicon, has patterned aluminum metallization 102 and is protected by a dielectric, moisture-impermeable protective overcoat 103, usually silicon nitride or oxynitride. A window has been opened in the overcoat 103 to expose metallization 102 and leave a protective perimeter 103a around metallization 102. An additional "under bump" metallization 104 has been deposited onto metallization 102 and patterned so that it overlaps by a distance 104a over the overcoat 103. This additional metallization 104 usually consists of a sequence of thin layers. The bottom layer is typically a refractory metal 105, such as chromium, titanium, or tungsten, which provides an ohmic contact to aluminum 102 and a moisture-impenetrable interface to overcoat 103. The top metal 106 is solderable; examples are gold, copper, nickel, or palladium. Finally, solder material is deposited, commonly by evaporation, plating or screen-printing, and reflowed to form bump 107. These solder bumps assume various shapes (examples are semi-spheres, domes and truncated balls) after the reflow process, influenced by the forces of surface tension during the reflow process.

During and after assembly of the IC chip by solder reflow to an external part such as a substrate or circuit board, and then during device operation, significant temperature differences and temperature cycles appear between semiconductor chip 100 and the substrate. The reliability of the solder joint is strongly influenced by the coefficients of thermal expansion (CTE) of the semiconductor material and the substrate material. For example, there is more than one order of magnitude difference between the coefficients of thermal expansion of the semiconductor material silicon (about 2 to 3 ppm/° C.) and the polymer-based material FR-4 (about 25 ppm/° C.). This CTE difference causes thermomechanical stresses, most of which the solder joints have to absorb. Detailed calculations involving the optimum height and volume of the solder connection and the expected onset of fatigue and cracking suggested a number of solder design solutions.

One method aims at absorbing part of the thermomechanical stress on the solder joints by plastic material surrounding the joints and filling the gap between chip and substrate. However, this so-called underfilling method represents an unwelcome process step after device attachment to the motherboard.

Figure 2:
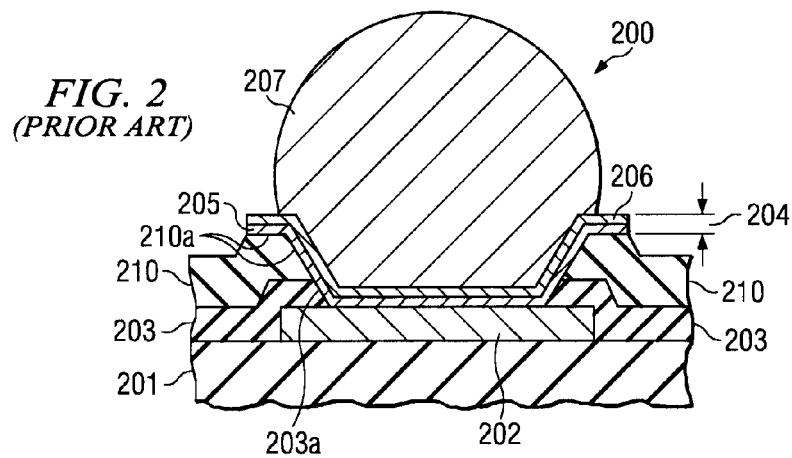
FIG. 2 is a schematic cross section of a portion of a solder bump and undermetal arrangement over the chip contact pad metallization according to known technology.

Another method applies a polymer layer on top of the protective overcoat with the aim of reducing the stress to the overcoat perimeter and the dielectric material underlying the contact pad. FIG. 2 illustrates schematically an example of a contact pad, generally designated 200, including a polymer overcoat. A silicon chip 201 has patterned metallization 202 (aluminum, copper, or an alloy thereof) and is protected by a moisture-impermeable inorganic overcoat 203 (for example, silicon nitride, about 1 μm thick) and a polymer layer 210 (for example, benzocyclobutene, polyimide, or similar polymers tolerant to the temperatures required for solder reflow, about 3 to 10 µm thick). A window has been opened through both overcoats. Layer 205 of the under-bump metallization 204 establishes contact to the metallization 202, and layer 206 provides solderability to the solder bump 207.

Experience has shown that the polymer layer 210 can absorb a significant portion of the thermo-mechanical stress created by temperature cycling; unfortunately, however, it turned out that it is difficult to provide reliable adhesion between polymer layer 210 and the under-bump metallization layer 204. Actually, the interface 203a of the inorganic overcoat 203 and the underbump refractory metal layer 205 is strong and reliable under temperature-cycle conditions. However, the interface 210a of the relatively thick polymer overcoat and the refractory metal layer 205 turned out to be sensitive to elevated temperatures or to temperature cycling and has a high probability of delamination.

The adhesion problem is aggravated by the process flow for chips with metallization 202 made of copper or a copper alloy (instead of aluminum). In addition, due to bondability and contact resistance issues of copper oxide, it is a challenge to establish reliable contact to solder material. Approaches based on adding an interface layer of aluminum, or of metals with higher affinity to oxygen than copper, are costly and not very effective.

Figure 3:
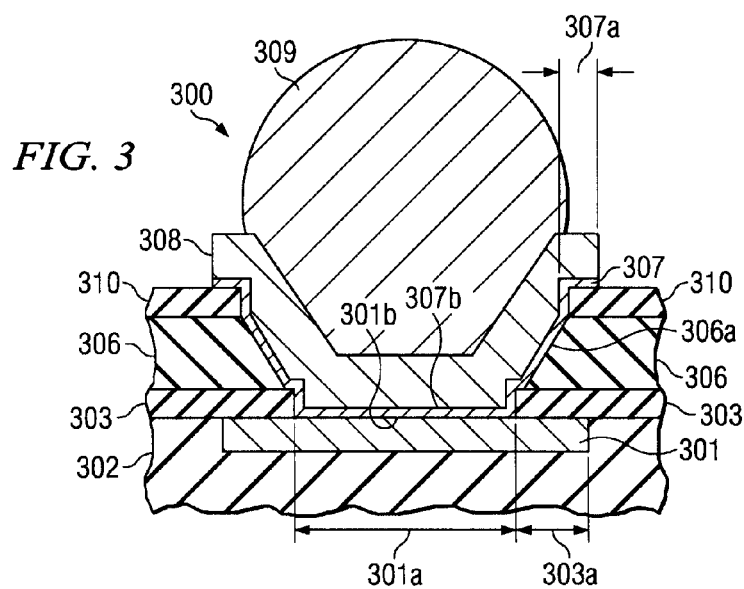
FIG. 3 is a schematic cross section of a chip contact pad, protected by a stack of insulator layers and contacted by a solder bump with seed layer and metal stud over the chip contact pad metallization, according to an embodiment the invention.

FIG. 3 illustrates an embodiment of the invention, which resolves these difficulties and shortcomings. The schematic cross section of FIG. 3 depicts a metal structure for a contact pad, generally designated 300, of an IC having copper interconnecting metallization 301. The top copper layer 301 of the IC is located over insulating material 302, which may include brittle, low-k compounds. Metallization 301 is protected by first inorganic overcoat 303, polymeric overcoat 306, and second inorganic overcoat 310. The first inorganic overcoat 303 consists preferably of silicon nitride or silicon oxynitride, preferably in the thickness range from about 0.5 to 2 µm. Other materials include silicon carbide, polyimide, or stacked layers thereof. Overcoat 303 overlaps the copper layer 301 by a length 303a. The organic overcoat 306 consists preferably of a polybenzoxazole compound, preferably in the thickness range from about 3 to 10 µm. Other suitable materials include polyimide, a polyamic acid, benzocyclobutene, polysiloxane, or related materials. The prime function of this organic material is to help absorb thermo-mechanical stress transferred by the solder bumps after the completion of the device assembly on external parts such as printed wiring boards.

The second inorganic overcoat 310 is a low-temperature silicon-based dielectric, preferably silicon dioxide; other materials include silicon nitride, silicon oxynitride, and stacked layers thereof. The second inorganic layer 310 has a thickness preferably in the range from about 0.5 to 2 µm. Inorganic overcoat 310 has excellent adhesion to polymer layer 306, and offers outstanding adhesion to the subsequent copper layers.

Overcoats 303 and 310, and especially the thicker overcoat 306 exhibit a slope 306a towards chip metallization 301, brought about by the etching of the overcoats during the window opening process for exposing metallization 301. Preferably, layer 301 is copper or a copper alloy; other metals, however, are sometimes used, for example, aluminum, an aluminum alloy, or a refractory metal.

After opening the window 301a, the surface 301b of the exposed metal is carefully cleaned; see the process detail below. The cleaning steps render the metal surface 301b free of oxide, organic residues, or any contamination so that the interface of metal 301 to the metal layer 307 contributes essentially no measurable electrical resistance to the resistance of contact pad 300. Metal layer 307 is frequently referred to as the "seed metal". In the preferred case of layer 301 being copper, seed metal layer 307 is also copper.

The seed metal layer 307 (deposition techniques see below) is patterned to overlay metal surface 301b and overcoat slopes 306a of the first inorganic layer, the polymer layer, and the second inorganic layer. The preferred thickness range of seed layer 307 is from about 0.3 to 0.8 µm. The overlap 307a of the seed metal on the second inorganic layer 310 has a length between about 5 and 15 µm. Due to this overlap 307a and the materials of the second inorganic overcoat 310 and the seed metal 307, the adhesion between seed metal 307 and inorganic layer 310 is so strong that it can sustain without delamination the thermomechanical stresses exerted by the solder joint.

Metal buffer layer 308 is deposited (various deposition methods see below) without contamination of the seed metal surface 307b. The buffer layer 308 has a thickness from about 10 to 20 µm and is, therefore, often referred to as a "stud". The stud 308 is preferably a single metal layer, preferably made of copper; however, other metal choices such as copper alloy or nickel are sometimes used. Alternatively, the stud 308 may be a stack of metal layers. In a preferred example, the stack of metal layers comprises copper in contact with the seed metal 307, nickel on top of the copper, and palladium as the outermost metal of the stud. The stud width is preferably equal to the extent of seed layer 307 and follows the contour of the overcoat slopes 306a.

The metallurgical contact pad structure for a flip-chip IC is completed by depositing a bump 309 of reflowable metal or alloys, often simply referred to as "solders" (deposition methods see below). Preferred reflowable materials include tin, indium, tin/indium, tin/silver, and tin/bismuth; for some applications, the conventional tin/lead alloy is still acceptable. Alternatively, conductive adhesives or z-axis conductive materials may be used. When electroplating is chosen as the method of depositing the metal stud 308, electroplating is the preferred method of depositing solder bumps 309. This method allows small-pitch solder bumps. When electroless plating is chosen as the method of depositing the metal stud, screen printing is preferred for the solder bumps; alternatively, pre-fabricated solder balls may be selected. These options result in somewhat larger bump pitch.

Figure 4:
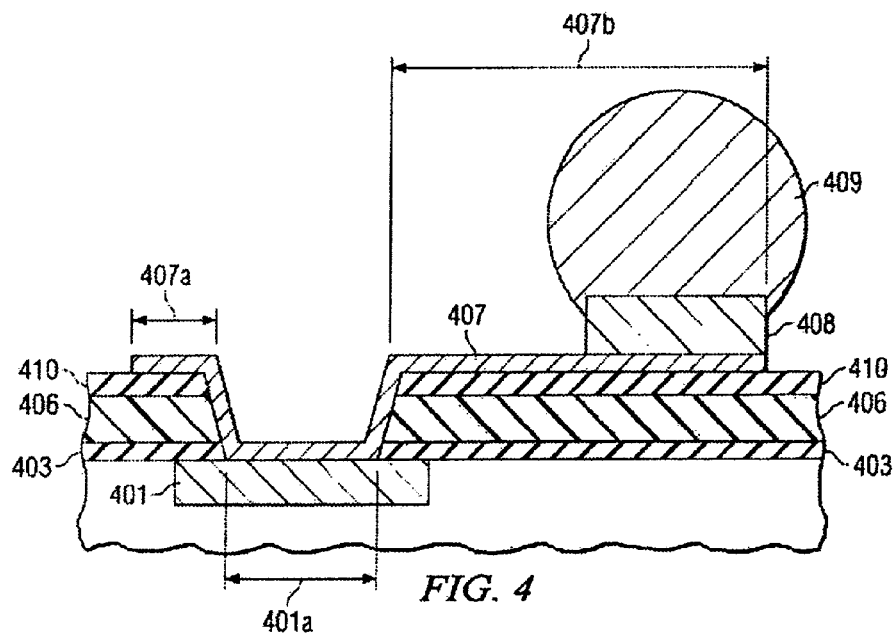
FIG. 4 is a schematic cross section of another embodiment of the invention, illustrating the rerouting of the solder bump location from the window to the chip metallization, with the chip surface protected by a stack of insulator layers.

Another embodiment of the invention is depicted in the schematic cross section of FIG. 4. An IC has a top metallization layer 401, for example copper. In many devices, metallization 401 may be in proximity to brittle low-k dielectrics inside the IC. A stack of overcoat layers protects the IC surface; the stack consists of the first inorganic overcoat 403 (for instance, silicon nitride or oxynitride), a polymer layer 406 (for example, polyimide or benzocyclobutene), and the second inorganic overcoat 410 (for example, silicon dioxide). A window of width 401a is opened in the overcoat stack and exposes the top metallization 401. A seed metal layer 407 (preferred example, copper) is deposited in window 401a and over the second inorganic overcoat 410. This seed metal layer is patterned so that it overlaps the window on all sides, providing excellent adhesion between the seed layer and the second inorganic overcoat. The overlap may be on the order of 5 to 15 µm on some window sides (length 407a in FIG. 4), but on other window sides the seed metal layer is patterned as a conductive trace (indicated as length 407b in FIG. 4) extending to a location remote from the window.

At some location of trace 407b, for instance at the end point as illustrated in FIG. 4, a buffer metal layer 408 may be deposited (for example, copper or copper alloy). This buffer metal, also referred to as a "stud", serves as the location for depositing a bump or ball 409 of reflowable metal or alloy, for example tin-alloyed solder. There are technical advantages to position the solder joints remote from window 401a and thus redistribute their locations. First of all, the redistribution permits uniformly patterned locations of the interconnection bumps, freeing them from the often crowded locations of the contact pads; frequently, this new degree of freedom also permits larger bump sizes. Secondly, at the remote bump positions, thicker buffer layers are available to mitigate thermo-mechanical stresses and thus protect neighboring brittle IC dielectrics. Significant thermo-mechanical stresses with their risk of introducing fracturing, which are typically exerted on the solder joints 409 during and after device assembly, are thus more distant from sensitive dielectrics under the contact pads, improving the device reliability.

Figure 5:
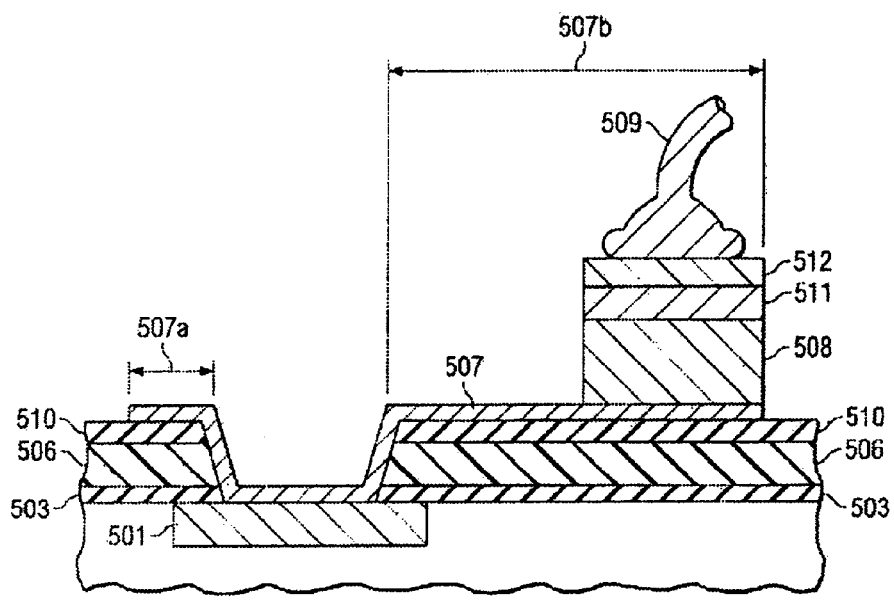
FIG. 5 is a schematic cross section of another embodiment of the invention, illustrating the rerouting of the wire bond location from the window to the chip metallization, with the chip surface protected by a stack of insulator layers.

Another embodiment of the invention is depicted in the schematic cross section of FIG. 5. A stack of overcoat layers protects the IC surface. The stack consists of the first inorganic overcoat 503 (for instance, silicon nitride or silicon oxynitride) directly on the IC surface, followed by a polymer layer 506 (for example, polyimide or benzocyclobutene), and the second inorganic overcoat 510 (for example, silicon dioxide) as topmost layer. A window is opened in the overcoat stack; it exposes a portion of the top IC metallization 501, which may be in close proximity to brittle low-k dielectric layers. A seed metal layer 507 (for example, copper) is deposited in the window and over the second inorganic overcoat 510. This seed metal layer 507 is patterned so that it overlaps the window on all sides, providing excellent adhesion between the seed layer 507 and the second inorganic overcoat 510. The overlap may be on the order of 5 to 15 μm on some window sides (such as length 507a in FIG. 5), but on other window sides the seed metal layer is patterned as a conductive trace (indicated as length 507b in FIG. 5) extending from the window to a location remote from the window.

At some location of trace 507b, for instance at the end point as illustrated in FIG. 5, a metal buffer is deposited as a stack of metal layers. Layer 508 of the buffer is in contact with the seed metal; a preferred choice is copper. Layer 511 preferably is nickel, and the outermost layer 512 preferably is palladium (alternatively gold).

Attached to the outermost metal layer 512 of the buffer is bond wire 509, shown in FIG. 5 as a ball bond. Preferred wire metal is gold or a gold alloy; other choices include copper, copper alloy, aluminum, and aluminum alloy. Alternatively, wedge bonds of metal ribbons may be used.

Another embodiment of the invention is a wafer-level method for completing the fabrication of bonding pads on IC wafers, which have interconnecting metallization (preferably copper) integral with the IC. After completing the formation of the ICs proper, the method includes a step of depositing over the wafer surface a stack of protection layers. First, a plasma and/or chemical vapor deposition technique forms the first inorganic layer; preferred materials include silicon nitride, silicon oxynitride, and silicon carbide.

Next, a spin-coating technique deposits a polymer layer; preferred materials include polyimides, polyamic acids, polybenzoxazoles, benzocyclobutenes, and polysiloxanes. These and related materials are commercially available from several American and Japanese suppliers including Arch Chemicals, Asahi Chemical, Dow Chemical, HD Microsystems, Toray, and Sumitomo-Bakelite. The glass transition temperatures of these materials are preferably between approximately 280 and 400° C., and their coefficients of thermal expansion can be tailored to a value between about 25 and 55 ppm/° C. The polymer materials typically undergo a polymerization cycle ("curing", cross linking of the polymer chains).

Finally, a low-temperature plasma and/or chemical vapor deposition technique forms the second inorganic layer. The preferred materials are silicon-based dielectrics including silicon dioxide, silicon nitride, silicon oxynitride, and stacked layers of these or similar compounds. The deposition temperature is preferably less than 300° C., preferably around 200° C.

In a process step after depositing the stack of protection layers, the stack is patterned by opening windows in the stack in order to expose selectively portions of the chip interconnection metallization. Thereafter, the semiconductor wafer including the topmost protective layer and the exposed metallization is subjected to a series of cleaning and etching steps as follows: exposing the wafer to organic solvents, thereby removing organic contamination and mechanical particles from the metal (copper) contact pads; drying the wafer in dry nitrogen; exposing the wafer to an oxygen and nitrogen/helium/argon plasma, thereby ashing any further organic residues on the metal (copper) contact pads and oxidizing the metal (copper) surface to a controlled thickness; and, without breaking the vacuum of the plasma chamber, exposing the wafer to a hydrogen and nitrogen/helium/argon plasma, thereby removing the controlled metal (copper) oxide from the surface of the exposed (copper) metallization and passivating the cleaned surface, which is then sputter-etched with energetic ions so that a fresh and activated surface is created.

More specifically, the step of exposing the wafer to solvents may be selected from processes such as submerging the wafer in agitated isopropyl alcohol (or, alternatively, in methanol, glycol, or N-methyl pyrrolidone, for example); adding ultrasonic energy to the solvent; spraying the wafer with an organic solvent; and treating the wafer in dry chemical vapor. Between the steps of oxygen plasma and hydrogen plasma, there may be a step of etching the wafer in an aqueous inorganic or organic acid, which helps to remove deep metal defects in the exposed windows.

Without delay, a layer of seed metal is then deposited to cover the fresh and activated surface of the wafer, preferably by a sputtering technique without breaking the chamber vacuum. When the chip metallization is copper, the seed metal may be a copper layer. Alternatively, the seed metal may be a stack made of a titanium/tungsten layer (facing the chip metallization) and a copper layer, or similar materials. The refractory layer and copper layer together form the seed metal layer. Other options include one or more refractory metals such as tantalum, titanium, tungsten, molybdenum, chromium, nickel, vanadium, or an alloy of any of these metals. When the chip metallization is aluminum or an aluminum alloy, the seed metal is preferably a stack of a refractory metal/alloy layer (contacting the aluminum) and a copper layer.

The seed layer provides strong adhesion to the topmost inorganic overcoat, cleaned and prepared as described above. Due to the adhesion, the interface between the seed metal and the insulating layer provides an essentially impenetrable seal against moisture or particles ingress from the ambient, and is able to withstand the thermo-mechanical stress exerted during and after the assembly of the chip.

Furthermore, the seed layer provides low electrical resistance, ohmic contact and low thermo-mechanical stress to the metal pad; it is, therefore, well suited for the following plating step.

In the next process step after depositing the seed metal layer, a photoresist layer is deposited and patterned to define the openings for exposing portions of the seed layer. Two options are available: In order to create the embodiment of FIG. 3, the photoresist openings coincide with the locations of the windows to the chip metallization. Alternatively, in order to create the embodiments of FIGS. 4 and 5, the photoresist openings are in locations remote from the windows to the chip metallization. The process flow continues with the step of exposing the seed metal layer in the openings to a hydrogen and nitrogen/argon plasma, which cleans and passivates the seed metal layer in the photoresist openings.

In order to create the embodiments of FIGS. 3 and 4, a buffer metal layer (308 and 408, respectively) is deposited onto the seed metal layer (307 and 407, respectively) exposed in the photoresist openings. The preferred material of the buffer layer is copper in the thickness range from about 1 to 20 µm. Alternatively, nickel can be used; its thickness is about 0.5 to 10 µm. The deposition is executed without exposing the passivated seed metal layer to fresh contamination, whereby two options are available: the preferred method is electrolytic plating; an alternative method is electroless plating. When the buffer layer is deposited as a copper layer by an electroless plating process, it is advantageous to use a plating bath for fine grain, low stress deposits. As an example, a suitable plating bath is commercially available as the "Circuposit" electroless copper 3350 from Shipley Company, Marlborough, Mass., USA.

In order to create the embodiment of FIG. 5, the buffer layer or stud 508 is deposited as described above. A barrier layer 511 is then deposited over the stud 508, preferably by an electroless plating technique. Material and thickness of the barrier layer 511 are selected to let it resist diffusion of the buffer metal. If the stud 508 is made of copper, the barrier layer should resist copper diffusion. Usually, the metal is less noble than copper and is preferably nickel; other options include tin, lead, cobalt, iron, chromium, zinc, magnesium, aluminum, and alloys thereof. When nickel is selected as barrier metal, the preferred thickness of the layer 511 is in the range from 1 to 5 µm. (As commonly practiced, the term "more noble metal" or "less noble metal" refers to the relative position of that particular metal compared to another metal in the table of electrochemical potentials, in which all metals are rank-ordered for their ability to be oxidized; the lower a metal is ranked, the harder it is to be oxidized and thus the more "noble" it is).

Next, the outermost layer 512 is deposited over the barrier layer 511, again preferably by an electroless plating technique. The top surface of the outermost layer 512 is smooth; its average surface roughness is less than about 50 nm. The material of layer 512 is preferably more noble than the material of layer 511 and the stud 508 and is selected so that it is wire bondable (ball, wedge, and ribbon bonding), meaning that a wire or ribbon will reliably adhere to the surface. Due to the surface smoothness of layer 512, wire bonding provides uniform metal interdiffusion and thus reliable welds. Preferably, layer 512 is made of gold or palladium; other options include silver, platinum, and alloys thereof. When gold is selected, layer 512 has a preferred thickness range from about 50 and 250 nm.

Next, the photoresist material is stripped; this step exposes the portions of the seed layer outside of the buffer metal. These seed layer portions are then removed by etching, conveniently in a wet etch solution of $H_2SO_4$, $H_2O_2$, and $NH_4OH$. Thus, the embodiment of FIG. 3 is created. In order to create the embodiments of FIGS. 4 and 5 with their conductive traces to allow a redistribution of the connections between the buffer metal and the windows to the chip metallization, a fresh photoresist layer is deposited and patterned to protect selected segments of the seed metal layer before the step of removing the exposed seed layer portions.

For the embodiments in FIGS. 3 and 4, a bump of reflowable metal (309 and 409, respectively) is deposited onto the buffer metal (308 and 408, respectively). For the embodiment of FIG. 5, a bonding wire 509 is attached to the outermost bondable layer 512.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

It is therefore intended that the appended claims encompass any such modifications and embodiments.

We claim:

1. A wafer-level method for the fabrication of bonding pads on integrated circuit wafers having interconnection metallization, comprising the steps of:
   depositing over the wafer surface a stack of protection layers comprising:
   a first layer of inorganic material;
   a layer of polymer material over said first inorganic layer; and
   a second layer of inorganic material over said polymer layer patterning said stack of protection layers by opening a plurality of windows in said stack to expose portions of said chip interconnection metallization;
   depositing a conductive seed layer covering said patterned stack; and
   depositing a buffer metal layer onto said exposed seed layer.

2. The method according to claim 1 wherein said step of depositing a buffer metal layer comprises depositing a buffer metal layer on said seed layer at a location remote from said window.

3. The method according to claim 1 wherein said buffer metal layer comprises a single metallic layer.

4. The method according to claim 3 further comprising the step of depositing a bump of reflowable metal onto said buffer metal layer.

5. The method according to claim 1 wherein said buffer metal layer comprises a stack of metal layers including an outermost bondable metal layer.

6. The method according to claim 5 further comprising the step of attaching a bonding wire to said outermost bondable layer of said stack.

* * * * *